(12) United States Patent
Huang et al.

(10) Patent No.: US 6,255,172 B1
(45) Date of Patent: Jul. 3, 2001

(54) ELECTRICALLY ERASABLE NON-VOLATILE MEMORY

(75) Inventors: Chih-Jen Huang, Hsinchu; Auter Wu, Yun-Lin Hsien; Shih-Fang Hong, Kaohsiung, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/567,918

(22) Filed: May 10, 2000

(51) Int. Cl.[7] .............................................. H01L 21/8247
(52) U.S. Cl. ............................................. 438/266; 438/261
(58) Field of Search ..................................... 438/257–267

(56) References Cited

U.S. PATENT DOCUMENTS

| | | | |
|---|---|---|---|
| 6,091,101 | * 7/2000 | Wang | 257/315 |
| 6,096,605 | * 8/2000 | Hong | 438/266 |
| 6,136,647 | * 10/2000 | Sung | 438/257 |

* cited by examiner

Primary Examiner—Richard Booth
(74) Attorney, Agent, or Firm—Jiawei Huang; J. C. Patents

(57) ABSTRACT

A method of manufacturing an electrically erasable non-volatile memory is suitable for use on a substrate. The method includes the following steps. First, a tunnel oxide layer is formed on the substrate. A floating gate and a silicon oxide layer/silicon nitride/silicon oxide layer is formed in order on the tunnel oxide layer. Next, a first oxide layer and a silicon nitride spacer are formed in order on the sidewalls of the floating gate. A second oxide layer is formed along the surface of the above entire structure. A third oxide layer is formed on the substrate on both sides of the silicon nitride spacer by oxidation. A patterned conductive layer on the substrate to serve as a control gate and a select transistor gate is formed above the substrate. Using the select transistor gate as a mask, the exposed part of the third oxide layer is removed to make the residual third oxide layer serve as a gate oxide layer of the select transistor. Finally, ion implantation is performed on the substrate to form source and drain regions.

11 Claims, 5 Drawing Sheets

ELECTRICALLY ERASABLE NON-VOLATILE MEMORY

BACKGROUND OF THE INVENTION

1. Field of the Invention

The invention relates to a structure of a memory and a method of manufacturing the same, and more particularly to a structure of an electrically erasable non-volatile memory and a method of manufacturing the same.

2. Description of the Related Art

A non-volatile memory which can still keep data stored therein even without any power source supplied, operates at a high speed and has a small volume and is shock proof, is worldwide used. In order to add, delete data, an electrically erasable nonvolatile memory is developed. All electrically erasable non-volatile memories have the same operational principle. That is, data can be amended by injecting/pulling out electrons into/from a floating gate thereby to control the channel between source and drain under the floating gate on and off. In other words, the turned-on or off channel indicates that one-bit data stored is "0" or "1."

One of electrically erasable non-volatile memories can store/erase data using a floating gate, a control gate and a select transistor. The operation of this electrically erasable non-volatile memory will be described in the following. To inject electrons into the floating gate (i.e., Channel Hot Electron Injection, CHEI), the electrically erasable non-volatile memory is first turned on through the control gate. Simultaneously, a high voltage is applied on the drain region to increase electron impacts thereby to generate a great amount of hot electrons. The hot electrons has high enough energy to pass through a tunnel oxide layer and then stay in the floating gate. Next, if it needs to pull out electrons stored in the floating gate, a high negative voltage must be applied on the control gate to thereby pull out the electrons to source using tunneling effect. The elect transistor can prevent the electrons from being excessively pull out. Therefore, the floating gate will not bring positive charges to cause a current leakage problem.

Referring to FIGS. 1A–1D, a method of manufacturing an electrically erasable nonvolatile memory is shown. Fist, in FIG. 1A, a substrate 100 having a tunnel oxide layer 110 and a polysilicon floating gate 120 already formed thereon is provided. In FIG. 1B, a silicon oxide layer 130, a silicon nitride layer 132 and a silicon oxide layer 134 (known as a structure of ONO) are formed on the substrate 100. Then, a polysilicon layer 140 is formed on the silicon oxide layer 134 as shown in FIG. 1C.

Thereafter, in FIG. 1D, the polysilicon layer 140 is patterned to form a control gate 140a and a select transistor gate 140b. The control gate 140a is located above the floating gate 120 with the ONO layer therebetween. The select transistor gate 140b is located on both sides of the floating gate 120 above the substrate 100 also with the ONO layer therebetween. Then, using the select transistor gate 140b as a mask, the silicon oxide layer 134, the silicon nitride layer 132, the silicon oxide layer 130 are etched to form a dielectric layer consisting of a silicon oxide layer 130a, a silicon nitride layer 132a and a silicon oxide 134a (ONO). Finally, ion implantation is performed on the substrate 100 to form source and drain regions 150 on both sides of the silicon oxide layer 130a.

In the prior art, the reason of using the ONO layer as a dielectric layer between the control gate 140a and the floating gate 120 is to increase the capacitance between the control gate 140a and the floating gate 120 to thereby increase the control gate coupling ratio and to decrease the operation voltage. The principle of increasing the capacitance using the ONO structure will be described in the following.

First, the silicon nitride layer 132a has a better capability of stopping electrons, and therefore, the dielectric layer including the silicon nitride layer can be thinner. Since silicon nitride has a great dielectric constant, the dielectric constant of the dielectric layer including the silicon nitride layer 132a can also be increased. Since the dielectric layer has a decreased thickness and an increased dielectric constant, the capacitance between the control gate 140a and the floating gate 120 is increased. Furthermore, since the silicon nitride layer 132a has a poor adhesive force with the control gate 140a and the floating gate 120 formed of ploysilicon, the silicon oxide layers 130a, 134a having a better adhesive force can be used between the silicon nitride layer 132a, the control gate 140a, and the floating gate 120 thereby to form a structure of ONO. However, the conventional electrically erasable non-volatile memory has the following problems.

First, since the volume of the device is further shrunk, the thickness of the ONO structure between the control gate 140a and the floating gate 120 must be decreased so as to maintain a proper control gate coupling ratio. This causes that the threshold voltage of the select transistor consisting of the select transistor gate 140b, the ONO layer under the select transistor gate and the substrate is reduced, too, resulting in a poor capability of preventing hot electrons from being excessively pull out. Therefore, if the volume of the device is shrunk, the control gate coupling ratio and the select transistor must be taken into account. This will cause the development of the device limited. Moreover, since it is easy for electrons to be captured in the silicon nitride 132 under a high voltage, the threshold voltage of the select transistor becomes unstable. This will cause that the device can not be easily controlled.

SUMMARY OF THE INVENTION

In view of the above, the invention is to provide a method of manufacturing an electrically erasable non-volatile memory for resolving the problem that the function of the select transistor is affected by the ONO structure as stated in the prior art.

A method of manufacturing an electrically erasable non-volatile memory includes the following steps. First, a substrate having a tunnel oxide layer formed thereon is provided. A first conductive layer and a silicon oxide/silicon nitride/silicon oxide layer are formed in order on the tunnel oxide layer. The silicon oxide/silicon nitride/silicon oxide layer and the first conductive layer are patterned, wherein the residual first conductive layer serves as a floating gate. A first oxide layer is formed on the sidewalls of the floating gate. A silicon nitride spacer is formed on the side walls of the first oxide layer. A second oxide layer is formed above the substrate. An oxidation reaction is performed to form a third oxide layer on the substrate on both sides of the silicon nitride spacer. A patterned second conductive layer consisting of a control gate and a select transistor gate which are electrically coupled to each other is formed, wherein the control gate is located on the second oxide layer above the floating gate, and the select transistor gate is located on the third oxide layer on both sides of the floating gate. The exposed part of the third oxide layer is removed to thereby form a gate oxide under the select transistor gate. Ion implantation is performed on the substrate to form source/drain regions in the substrate on both sides of the gate oxide layer.

As described above, the thickness of the gate oxide layer of the select transistor is additionally increased using thermal oxidation in the present invention. Therefore, when the volume of the device is shrunk, the thickness of the ONO structure can be reduced to maintain a proper control gate coupling ratio, and the thickness of the gate oxide layer can be adjusted to an optimized value. Furthermore, the surface of the floating gate is protected by the silicon nitride layer of the ONO structure from being oxidized when the thickness of the gate oxide layer of the select transistor is additionally increased by oxidation. Therefore, the thickness of the ONO structure can not be increased due to oxidation.

Moreover, Since the gate dielectric layer of the select transistor is a silicon oxide layer, not an ONO layer, electrons can not be captured by the silicon nitride layer. As a result, the device can stably operate under a high voltage.

BRIEF DESCRIPTION OF THE DRAWINGS

The invention will be more fully understood from the detailed description given hereinbelow and the accompanying drawings, which are given by way of illustration only, and thus do not limit the present invention, and wherein.

DETAILED DESCRIPTION OF THE PREFERRED EMBODIMENTS

Embodiment 1

Figure 1A:
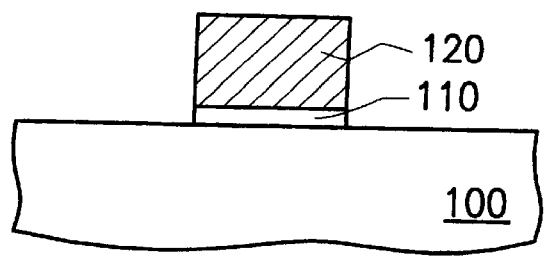
FIGS. 1A–1D are schematic, cross-sectional views showing a method of manufacturing an electrically erasable non-volatile memory according to the prior art.
Figure 1B:
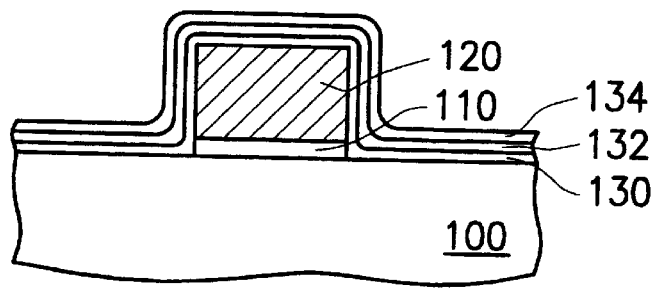
Figure 1C:
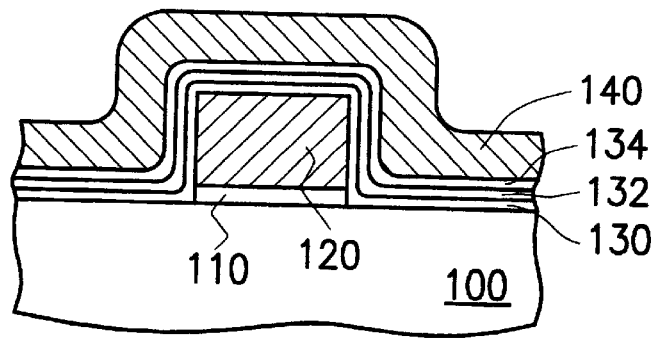
Figure 1D:
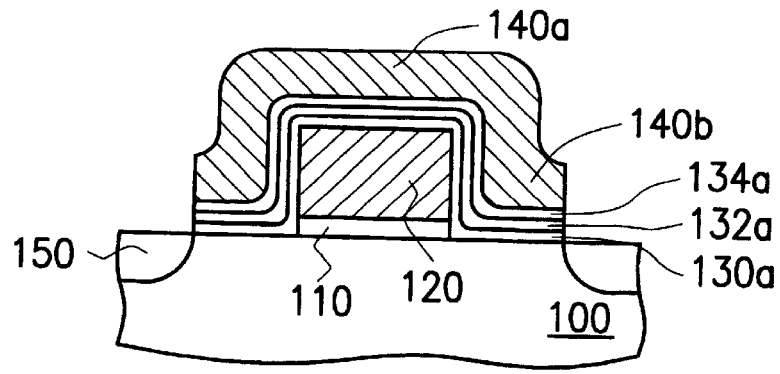
Figure 2A:
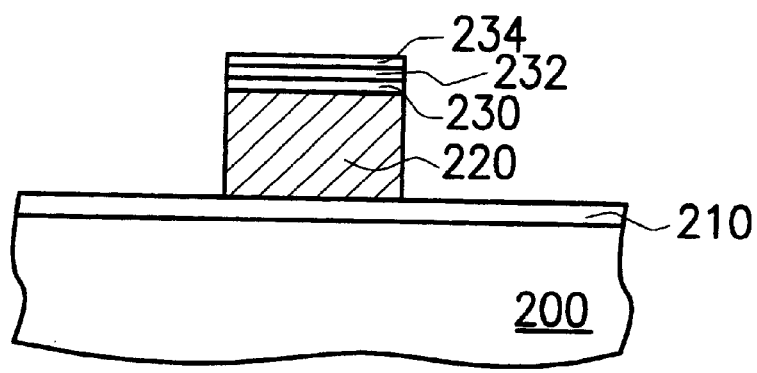
FIGS. 2A–2E are schematic, cross-sectional views showing a method of manufacturing an electrically erasable non-volatile memory according to a first preferred embodiment of the invention.

FIGS. 2A–2E are schematic, cross-sectional views showing a method of manufacturing an electrically erasable non-volatile memory according to a first preferred embodiment of the invention. Referring to FIG. 2A, a substrate 200 having a tunnel oxide layer 210 formed thereon is provided. A conductive layer and a silicon oxide/silicon nitride/silicon oxide layer (not shown) are formed in order on the tunnel oxide layer 210. The conductive layer and the silicon oxide/silicon nitride/silicon oxide layer are patterned to form an ONO structure consisting of a silicon oxide layer 230, a silicon nitride layer 232, a silicon oxide layer 234 and a floating gate 220. The floating gate 220 can be made of polysilicon, for example, by chemical vapor deposition (CVD).

Figure 2B:
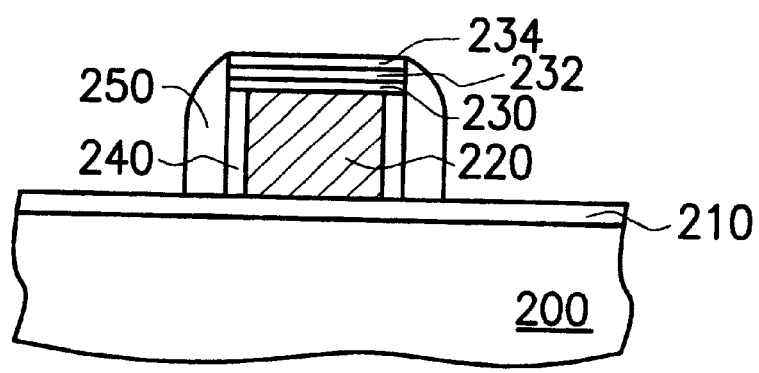

Referring to FIG. 2B, a silicon oxide layer 240 is formed on the sidewalls of the floating gate 220, for example, by thermal oxidation. Then, a silicon nitride spacer 250 is formed on the sidewalls of the silicon oxide layer 230, the silicon nitride layer 232, the silicon oxide layer 234 and the silicon oxide layer 240. As a result, on the sidewalls of the floating gate 220, there is a structure of a silicon oxide/silicon nitride layer consisting of the silicon oxide layer 240 and the silicon nitride spacer 250.

Figure 2C:
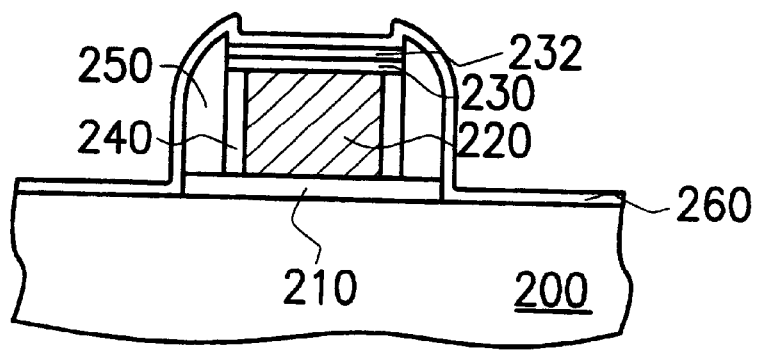

Referring to FIG. 2C, the exposed tunnel oxide layer 210 on the both sides of the silicon nitride spacer 250 is removed by anisotropic etching, such as, wet etching. At the same time, the silicon oxide layer 234 on the top of the ONO structure is also removed. The reason to perform this etching process is that the uneven surface of the tunnel oxide layer 210 generated when the exposed tunnel oxide layer 210 is bombarded by ions during the formation of the silicon nitride spacer 250 using anisotropic etching will affect the duality of a subsequently-formed gate oxide.

Referring to FIG. 2C, a silicon oxide layer 260 is formed along the surface of the above entire structure. As a result, the sidewalls of the floating gate 220 has an ONO structure (consisting of a silicon oxide layer 240, a silicon nitride spacer 250 and a silicon oxide layer 260), and on the top of the floating gate 220, there is also an ONO structure (consisting of a silicon oxide layer 230, a silicon nitride 232 and a silicon oxide layer 260) formed.

Figure 2D:
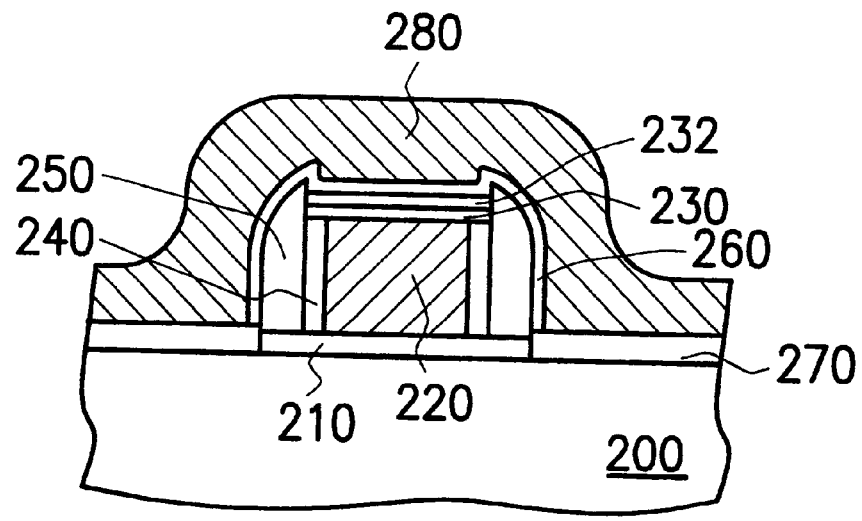

Referring to FIG. 2D, for example, thermal oxidation, is performed to form an oxide layer 270 on the substrate 200 on both sides of the silicon nitride spacer 250. The oxide layer 270 includes part of the silicon oxide layer 260 on both sides of the silicon nitride spacer 250. During the thermal oxidation, the surface of the floating gate 220 covered with the silicon nitride layer 232 is not oxidized. Therefore, the thickness of the silicon nitride 230 above the floating gate 220 will not increase to affect the control gate coupling ratio. Next, a conductive layer 280, such as a polysiliocn layer, is formed above the substrate 200, for example, by CVD.

Figure 2E:
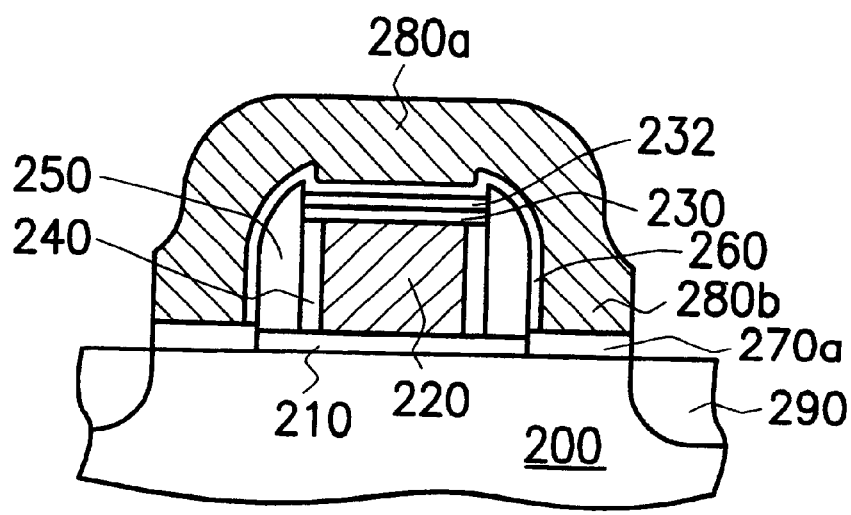

Referring to FIG. 2E, the conductive layer 280 is patterned to form a control gate 280a and a select transistor gate 280b. The control gate 280a is located above the floating gate 220 with an ONO structure (consisting of the silicon oxide layer 220, the silicon nitride layer 230 and the silicon oxide layer 260) therebetween. The select transistor gate 280b is located on the oxide layer 270. Next, using the select transistor gate 280b as a mask, the exposed part of the oxide layer 270 is removed to form a gate oxide layer 270a serving as a dielectric layer of the select transistor. Finally, ion implantation is performed on the substrate 200 to form source and drain regions 290 in the substrate 200 on both sides of the gate oxide layer 270a.

Embodiment 2

Figure 3A:
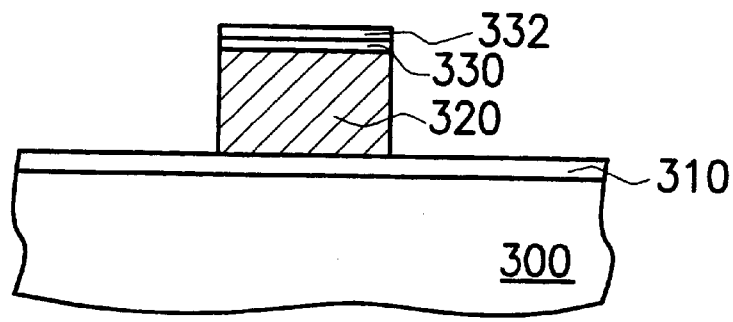
FIGS. 3A–3E are schematic, cross-sectional views showing a method of manufacturing an electrically erasable non-volatile memory according to a second preferred embodiment of the invention.

FIGS. 3A–3E shows a method of manufacturing an electrically erasable non-volatile memory according to a second preferred embodiment of the invention. Referring to FIG. 3A, first, a substrate 300 having a tunnel oxide layer 310 formed thereon is provided. A conductive layer and a silicon oxide/silicon nitride layer (not shown) are formed in order on the tunnel oxide layer 310. The silicon oxide/silicon nitride layer and the conductive layer are patterned in order to form a silicon oxide layer 330, a silicon nitride layer 332 and a floating gate 320. The floating gate 320 is made of, for example, polysilison by CVD.

Figure 3B:
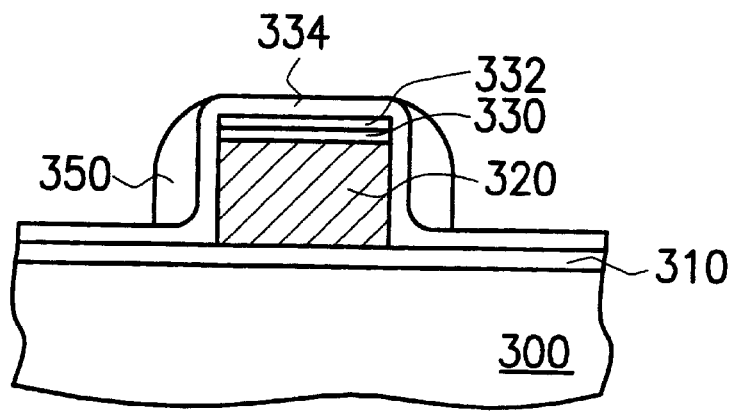

Referring to FIG. 3B, a silicon oxide layer 334 is formed along the surface of the above entire structure, for example, by CVD. Then, a silicon nitride spacer 350 is formed on the sidewalls of the silicon oxide layer 334 thereby to construct a silicon oxide/silicon nitride layer (consisting of the silicon oxide layer 334 and the silicon nitride layer 350) on the sidewalls of the floating gate 320.

Figure 3C:
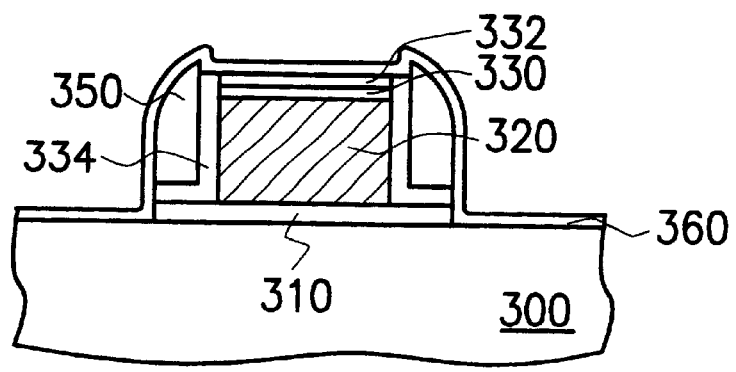

Referring to FIG. 3C, like the first preferred embodiment, anisotropic etching, such as wet etching, is performed to remove parts of the silicon oxide layer 334 and the tunnel oxide layer 310 which are uncovered by the silicon nitride spacer 350. Thereafter, a silicon oxide layer 360 is formed along the surface of the above entire structure thereby to construct an ONO structure (consisting of the silicon oxide 334, the silicon nitride spacer 320 and the silicon oxide layer 360) on the sidewalls of the floating gate 320 and another ONO structure (consisting of the silicon oxide layer 330, the silicon nitride layer 332 and the silicon oxide layer 360) on the top of the floating gate 320.

Figure 3D:
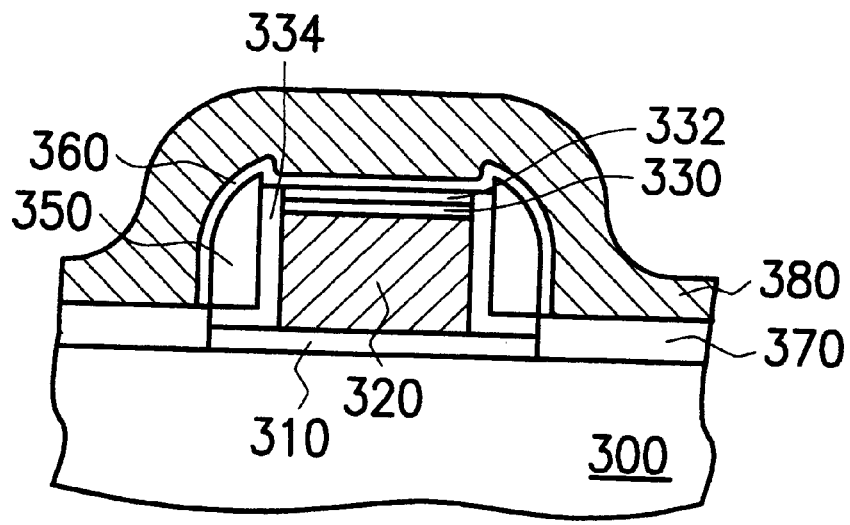

Referring to FIG. 3D, for example, thermal oxidation, is performed to form an oxide layer 370 on the substrate 200 on both sides of the silicon nitride spacer 350. The oxide layer 370 includes part of the silicon oxide layer 360 on both sides of the silicon nitride spacer 350. During the thermal oxidation, the surface of the floating gate 320 covered with the silicon nitride layer 332 is not oxidized. Therefore, the thickness of the silicon nitride 330 above the floating gate 320 will not increase to affect the control gate coupling ratio. Next, a conductive layer 380, such as a polysiliocn layer, is formed above the substrate 300, for example, by CVD.

Figure 3E:
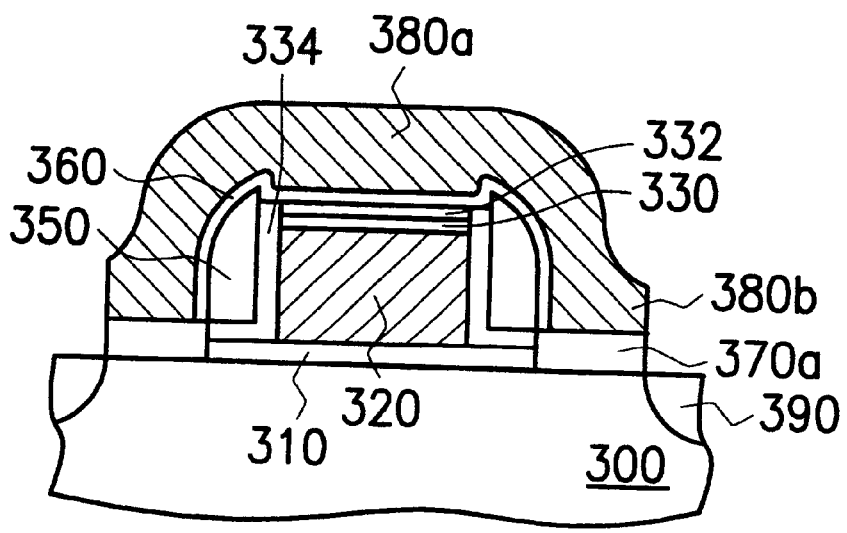

Referring to FIG. 3E, the conductive layer 380 is patterned to form a control gate 380a and a select transistor gate 380b. The control gate 380a is located above the floating gate 320 with the ONO structure (consisting of the silicon oxide layer 330, the silicon nitride layer 332 and the silicon oxide layer 360) therebetween. The select transistor gate 380b is located on the oxide layer 370. Next, using the select transistor gate 380b as a mask, the exposed part of the oxide layer 370 is removed to form a gate oxide layer 370a serving as a dielectric layer of the select transistor. Finally, ion implantation is performed on the substrate 300 to form source and drain regions 390 in the substrate 300 on both sides of the gate oxide layer 370a.

In the above described preferred embodiments, the thickness of the gate oxide layer of the select transistor is additionally increased using thermal oxidation. Therefore, when the volume of the device is shrunk, the thickness of the ONO can be reduced to maintain a proper control gate coupling ratio, and the thickness of the gate oxide layer can be adjusted to an optimized value. Furthermore, the surface of the floating gate is protected by the silicon nitride layer of the ONO structure from being oxidized when the thickness of the gate oxide layer of the select transistor is additionally increased by oxidation. Therefore, the thickness of the ONO structure can not be further increased due to oxidation.

Moreover, Since the gate dielectric layer of the select transistor is a silicon oxide layer, not an ONO layer, electrons can not be captured by the silicon nitride layer. As a result, the device can stably operate under a high voltage. In addition, the uneven surface of the silicon oxide layer on the substrate is removed by etching after the silicon nitride spacer is formed. Therefore, the subsequently-formed gate oxide can obtain a better quality to make the operation of the device more stable.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of manufacturing an electrically erasable non-volatile memory, suitable for use on a substrate, comprising the steps of:

forming a tunnel oxide layer on the substrate;

forming a first conductive layer and a silicon oxide/silicon nitride/silicon oxide layer in order on the tunnel oxide layer;

patterning the silicon oxide/silicon nitride/silicon oxide layer and the first conductive layer in order, the residual conductive layer serving as a floating gate;

forming a first oxide layer on the sidewalls of the floating gate;

forming a silicon nitride spacer on the sidewalls of the first oxide layer;

forming a second oxide layer above the substrate;

performing an oxidation reaction to form a third oxide layer on the substrate on both sides of the silicon nitride layer;

forming a patterned second conductive layer thereby to form a control gate and a select transistor gate which are electrically coupled to each other, wherein the control gate is located on the second oxide layer above the floating gate, and the select transistor gate is located on the third oxide layer on both sides of the floating gate;

removing the exposed part of the third oxide layer to thereby form a gate oxide under the select transistor gate; and performing ion implantation on the substrate to form source/drain regions in the substrate on both sides of the gate oxide layer.

2. The method of claim 1, wherein materials used to form the first conductive layer comprise polysilicon.

3. The method of claim 1, wherein materials used to form the second conductive layer comprise polysilicon.

4. The method of claim 1, wherein the first oxide layer on the sidewalls of the floating gate is formed by thermal oxidation.

5. The method of claim 1, wherein the third oxide layer on the substrate on both sides of the silicon nitride layer is formed by thermal oxidation.

6. The method of claim 1, further comprising: removing the tunnel oxide layer on both sides of the silicon nitride spacer and the top silicon oxide layer of the silicon oxide/silicon nitride/silicon oxide layer by anisotropic etching before the formation of the second oxide layer, thereby to form a silicon oxide/silicon nitride layer on the floating gate.

7. A method of manufacturing an electrically erasable non-volatile memory, suitable for use on a substrate having a tunnel oxide layer formed thereon, the method comprising the steps of:

forming a first conductive layer and a silicon oxide/silicon nitride layer in order on the tunnel oxide layer;

patterning the silicon oxide/silicon nitride layer and the first conductive layer, the residual conductive layer serving as a floating gate;

forming a first oxide layer above the substrate;

forming a first silicon nitride spacer on the sidewalls of the first oxide layer;

forming a second oxide layer above the substrate;

performing an oxidation reaction to form a third oxide layer on the substrate on both sides of the silicon nitride spacer;

forming a patterned second conductive layer which consists of a control gate and a select transistor gate electrically connected to each other, wherein the control gate is located on the second oxide layer above the floating gate, and select transistor gate is located on the third oxide layer on both sides of the floating gate;

removing the exposed part of the third oxide layer using the select transistor gate as a mask to thereby form a gate oxide layer under the select transistor gate; and performing ion implantation on the substrate to thereby form source/drain regions in the substrate on the both sides of the gate oxide layer.

8. The method of claim 7, wherein materials used to form the first conductive layer comprise polysilicon.

9. The method of claim 7, wherein materials used to form the second conductive layer comprise polysiliocn.

10. The method of claim 7, wherein the third oxide layer on the substrate on both side of the silicon nitride spacer is formed by thermal oxidation.

11. The method of claim 7, further comprising: removing part of the first oxide layer on both sides of the silicon nitride layer and part of the tunnel oxide layer on both sides of the silicon nitride layer and part of the first oxide layer above the silicon oxide/silicon nitride layer by anisotropic etching before the formation of the second oxide layer.

* * * * *